United States Patent [19]

Felkel et al.

[11] 4,095,116
[45] June 13, 1978

[54] ELECTRO-OPTICAL COUPLING ELEMENT

[75] Inventors: Gerfried Felkel, Neubiberg; Gerhard Maier, Munich; Wolfgang Guenzel, Munich; Guenther Waitl, Munich, all of Germany

[73] Assignee: Siemens Aktiengesellschaft, Berlin & Munich, Germany

[21] Appl. No.: 805,992

[22] Filed: Jun. 13, 1977

[30] Foreign Application Priority Data

Jun. 22, 1976 Germany .............................. 2627944

[51] Int. Cl.$^2$ .............................................. G02B 27/00
[52] U.S. Cl. ....................................... 250/551; 357/19
[58] Field of Search ........................... 357/19; 250/551

[56] References Cited

U.S. PATENT DOCUMENTS 3,153,149  10/1964  Finigian ............................... 250/551
4,045,120  8/1977  Corlieu ................................. 250/551

Primary Examiner—David C. Nelms
Assistant Examiner—Michael J. Tokar
Attorney, Agent, or Firm—Hill, Gross, Simpson, Van Santen, Steadman, Chiara & Simpson

[57] ABSTRACT

A useful current component of an electro-optical coupling element is increased by providing a synthetic resin coupling medium having an adhered unitary encapsulating mass composed of the identical synthetic resin forming the coupling medium and containing therein a radiation reflecting material, such as titanium dioxide and a radiation impermeable material, such as aluminum bronze.

16 Claims, 1 Drawing Figure

U.S. Patent     June 13, 1978     4,095,116
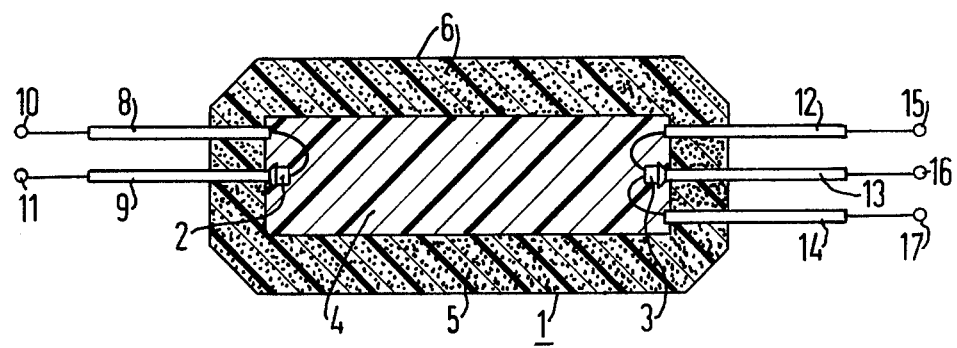

ELECTRO-OPTICAL COUPLING ELEMENT

BACKGROUND OF THE INVENTION

1. Field of the Invention

The invention relates to electro-optical components and somewhat more particularly to electro-optical coupling elements having a coupling medium between an optical transmitter and an optical receiver.

2. Prior Art

Suggestions have been made in the art to form an electro-optical coupling element so that such element reflects radiation emitted by the optical transmitter and is impermeable by exterior optical radiation. Generally, such elements were in the form of an optical coupling medium enveloped by a mass composed of two separate components or layers. The inner or first component about the coupling medium contained titanium dioxide particles to reflect the radiation emitted by the optical transmitter. The outer or second component about such coupling elements contained a coloring agent to prevent exterior optical radiation from penetrating into the coupling element. With this type of construction, two separate operations were required to apply the first and second layer of the encapsulating mass. Such separate operations required a correspondingly complex technical procedure and additional time, leading to an increased cost for such end products.

SUMMARY OF THE INVENTION

The invention provides an electro-optical coupling element or device wherein the above prior art disadvantages are minimized and more economic coupling devices are attained.

In accordance with the principles of the invention, an electro-optical coupling element or device is comprised of an optical coupling medium enveloped by a single component encapsulating mass which reflects radiation emitted from an optical transmitter within such device and is substantially impermeable to optical radiation outside the coupling device whereby a high transformation ratio of the electro-optical coupling element is achieved, along with a high useful current component and a low interference component at extremely low labor and cost requirements.

In accordance with the invention, the coupling medium and the enveloping mass are provided with a base which is composed of a similar chemical composition, and in preferred embodiments consists of an identical synthetic resin, such as an epoxy resin, so that there is good adhesion between the coupling medium and the enveloping mass. The enveloping or encapsulating mass is provided with an admixture of a first material, such as titanium dioxide, which renders the mass highly reflective to optical radiation transmitted from an optical transmitter therein and a second material, such as aluminum bronze, which renders the encapsulating mass highly impermeable to exterior optical radiation. The one-step application of such an encapsulating mass provides a considerable reduction in the cost of electro-optical coupling elements, particularly during the mass production of such elements.

In an exemplary embodiment of the invention, the electro-optical coupling element is comprised of a synthetic resin coupling medium encapsuled with a mass having a layer thickness of about 0.5 to 20 mm and consisting of the same synthetic mass that forms the coupling medium and which has intermixed therein about 10% to 30% by weight (based on weight of resin in the mass) of titanium dioxide and about 0.1% to 0.3% by weight (same basis) of aluminum bronze.

BRIEF DESCRIPTION OF THE DRAWING

The FIGURE is an elevated somewhat schematic cross-sectional view of an electro-optical coupling element produced in accordance with the principles of the invention.

DESCRIPTION OF THE PREFERRED EMBODIMENTS

The invention provides an electro-optical coupling element or device, with a coupling medium positioned between an optical transmitter and an optical receiver encapsuled or encompassed by an optically protective mass. The coupling medium is optically transmissive while the protective mass is substantially non-transmissive. The coupling medium and the encapsulating mass, at least in the operative zone of the electro-optical coupling device, exhibit good adhesion strength for one another and have an approximately identical dielectric constant. The encapsuling mass has the property or reflecting optical radiation emitted from the optical transmitter and is optically impermeable to optical radiation from outside the coupling device, particularly within the sensitivity range of the optical receiver.

Electro-optical coupling devices produced in accordance with the principles of the invention exhibit a high transformation ratio, a high useful current component and a low interference current component and are extremely economical.

In accordance with the principles of the invention, a unitary substantially homogeneous encapsulating mass is provided about an optical coupling medium. Such single-layer mass includes a matrix composed of a synthetic resin having a chemical composition base similar and preferably identical to the chemical composition base of the optical coupling medium. A first material is substantially homogeneously dispersed within such matrix so as to render the encapsulating mass a highly reflective medium for optical radiation emitted by the optical transmitter. A second material is also substantially homogeneously distributed or dispersed within the matrix so as to render the encapsuling mass a highly optically impermeable medium to optical radiation exterior of the encapsulating mass. The one-step application of such a unitary encapsuling mass on a coupling medium is extremely advantageous in reducing costs, particularly during the mass production of electro-optical coupling devices of this type.

In a preferred embodiment of the invention, the coupling medium and the encapsulating mass are comprised of a synthetic material. The use of synthetic materials is particularly preferred because of the advantages offered thereby relative to the filling or grouting utilized and because of the processing advantages available when working with synthetic materials. In order to achieve good adhesion between the coupling medium and the encapsulating mass, it is preferable that both the coupling medium and the encapsulating mass be provided with a base of uniform chemical composition, particularly a base consisting of one and the same synthetic resin. Such identity in chemical composition between the two elements ensures good adhesive strength therebetween. This is important since the storage and operative environments for electro-optical capsules typically include temperatures in the range of about −55° C. to +125° C. and it is generally impossible to achieve good adhesion between a coupling medium and an encapsulating mass in instances where such elements are based on different chemical compositions. Thus, fissures, cracks, raised areas, etc. frequently occur between a coupling medium composed of a chemical different from that of the enveloping mass and such disturbances tend to produce regions having different dielectric characteristics, which in turn cause premature sub-discharge phenomena when high voltages are applied between a transmitter and a receiver within such an element. In accordance with the invention, these disadvantages are avoided by utilizing a base of an identical or substantially identical chemical composition for both the coupling medium and the encapsulating mass.

In preferred embodiments of the invention, the above-mentioned first material within the encapsulating mass preferably consists of titanium dioxide particles. The use of titanium dioxide is particularly suitable for internal reflection of optical radiation, particularly in a base of matrix of a synthetic material. In preferred embodiments of the invention, the amount of such first material (which preferably is composed of titanium dioxide); on a weight basis based on the weight of synthetic material in the encapsulating mass, ranges from about 10% to 30%. In an examplary embodiment, a 30% by weight addition of titanium dioxide within the encapsulating mass has been found to be particularly desirable.

In preferred embodiments of the invention, the above-mentioned second material within the encapsulating mass consists of aluminum bronze (typically 95% Cu and 5% Al). Additions of aluminum bronze materially reduces the radiation transmitting power of the encapsulating mass in the spectral range which contains the sensitivity range of receivers within electro-optical coupling devices. By judicious selection of a suitable concentration of aluminum bronze in the encapsulating mass and by a judicious selection of a suitable layer thickness for the encapsulating mass, the encapsulating mass may be rendered into a highly optically impermeable medium for optical radiation exterior of the coupling device. In preferred embodiments, the amount of aluminum bronze in the encapsulating mass ranges from about least about 0.5% to about 0.3% by weight, on the basis of the weight of resin in the encapsulating mass.

In preferred embodiments of the invention, the encapsulating mass is provided in a layer thickness which ranges from about 0.5 mm to about 20 mm. In a preferred exemplary embodiment of the invention, an encapsulating mass layer thickness of 2 mm has been found to be particularly desirable.

The layer thickness of the encapsulating mass, the concentration of the first material, such as titanium dioxide, and the concentration of the second material, such as aluminum bronze, within such encapsulating mass decisively influences the efficiency of an electro-optical coupling element produced in accordance with the principles of the invention, particularly as regards the reflection of radiation emitted from the optical transmitter and the screening of exterior optical radiation from outside of the coupling device.

It is advantageous for the encapsulating mass of the invention to possess a reflecting power of about 50%, relative to the radiation emitted from the optical transmitter and an absorption capacity of at least 98% for the optical radiation entering from outside the coupling device.

In accordance with the principles of the invention, the electro-optical coupling element of the invention preferably has a high voltage strength of at least 4 KV. A high voltage strength allows such coupling elements or devices to operate with a correspondingly high operative voltage, which is of special significance under certain conditions of use.

A further development of the inventive principles is to mix a coloring agent, such as a dye or pigment, into the encapsulating mass. Coloring agents having suitable absorption curves can, on the one hand, improve the impermeability of the encapsulating mass to optical radiation exterior from the coupling device and, on the other hand, produce an aesthetically pleasant color in such coupling devices. A prerequisite of coloring agents used is that they must not have an absorptive action in the spectral range in which the transmitter of a given electro-optical device is operating.

The electro-optical devices of the invention may advantageously contain one or more diode therein, i.e., a luminescent diode as an optical transmitter and one or more transistors, thyristors or photo-IC elements as an optical receiver.

The drawings shows a schematic illustration through a cross-section of an electro-optical coupling device 1 produced in accordance with the principles of the invention. An optical transmitter 2 is optically and mechanically connected with an optical receiver 3 by means of a coupling medium 4 composed of a synthetic material. The coupling medium 4 is enveloped by an encompassing mass 5 which is composed of a synthetic material and is provided with additions or fillers, such as titanium dioxide and aluminum bronze, such as indicated by points 6. Suitable connecting wires 8 and 9 are provided at one end of element 1 for interconnecting the optical transmitter 2 with terminals 10 and 11 and suitable connecting wires 12, 13 and 14 are provided at the other end of element 1 for interconnecting the optical receiver 3 with terminals 15, 16 and 17.

An electro-optical coupling device of the invention may contain a diode, such as a luminescent diode, as the optical transmitter therefor. The coupling device may also contain diodes, such as individual transistors or a plurality of transistors as in a Darlington circuit, thyristors or photo-ICs, as the optical receiver within such device. The coupling medium may be composed of any material which exhibits a sufficiently good electrical insulating characteristic, is highly transmissive to optical radiation, which exhibits a suitable dielectric constant (which approximately corresponds to the dielectric constant of the encapsulating mass) and which, in the temperature range of about −55° C. to +125° C., provides adequate adhesive strength between such coupling medium and the encapsulating mass. Materials used in accordance with the principles of the invention for the encapsulating mass must, in addition to the above recited properties, exhibit an ability to reflect radiation emitted from the optical transmitter, with a reflective capacity or power of at least 50% and must be highly impermeable to optical radiation exterior of the coupling device, i.e., have an absorption of at least 98%.

In a presently preferred exemplary embodiment of the invention, a clear synthetic resin, such as an epoxy (R), is utilized as the coupling medium and the identical resin, i.e., epoxy resin (R) is used as the base or matrix for the encapsulating mass. In such exemplary embodiment, the encapsulating mass has a layer thickness ranging from about 0.2 mm to 20 mm and preferably is about 2 mm and contains therein a substantially uniformly dispersed amount of first material particles, which amount ranges from about 10% to 30% by weight, based on the weight of the encapsulating mass, and preferably about 30% by weight of uniformly dispersed titanium dioxide particles and contains therein a substantially uniformly dispersed amount of second material particles, which amount ranges from at least 0.1% to 0.3% by weight (same basis) and preferably about 0.3% by weight of uniformly dispersed aluminum bronze particles. Such admixtures of titanium dioxide and aluminum bronze particles produce good reflectivity in the wave-length range of optical transmitters (i.e., for a gallium arsenide luminescent diode having an emission range of about 900 to 960 nm), and at the same time produces an extremely low permeability to optical radiation exterior of the coupling device. The aluminum bronze material preferably consists of very finely ground aluminum-containing particles. An oxide film, which forms on the surface of aluminum particles, functions to electrically insulate such particles from one another so that even when such particles are mixed within synthetic materials, there is virtually no change in the good electrical insulating characteristics of the synthetic materials.

In order to further improve the optical impermeability of the encompassing mass to exterior optical radiation and in order to achieve an aesthetically pleasant color for such electro-optical coupling devices, the encapsulating mass may be provided with a further coloring agent, provided such agent, for example, a dye, has little, if any, absorptive action in the wavelength range of the optical transmitter. A preferred coloring agent is one which has the above low absorptive action in the wavelength range of the optical transmitter and a strong absorptive action in the wavelength range of exterior optical radiation.

The addition of titanium dioxide and aluminum bronze within an encapsulating mass in the exemplary embodiments set forth above provides an improvement of about 100% to 500% in optical coupling in comparison with corresponding electro-optical coupling devices having a black-colored encapsulating mass. The transformation ratio of coupling devices produced in accordance with the principles of the invention is thus improved by a factor of 2 or more.

The receiver-end current amplification of electro-optical devices of the invention can thus be reduced appropriately in order to achieve the same overall current amplifications so that when transistors are utilized as optical receivers, more accurate data, particularly at high temperatures and high operating voltages, is attained.

In comparison to electro-optical coupling devices having a two-layered encapsulating mass, electro-optical coupling devices of the invention are much simpler to produce and require much shorter working time, which, of course, provides a corresponding reduction in costs.

The electro-optical coupling devices produced in accordance with the principles of the invention are especially useful under high voltage stresses and have a high voltage strength of at least 4 KV.

The foregoing is considered illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention as claimed.

We claim as our invention:

1. In an electro-optical coupling device having a coupling medium mechanically and optically connecting an optical transmitter and an optical receiver and an encapsulating mass about such coupling medium, wherein the coupling medium is optically transmissive and the encapsulating mass reflects the radiation emitted from said optical transmitter and is relatively impermeable by optical radiation exterior of such coupling device for the sensitivity range of said optical receiver, the improvement comprising wherein:

said encapsulating mass is a single substantially homogeneous layer containing therein an amount of a substantially uniformly dispersed first material particles which renders said encapsulating mass into a highly reflective medium for radiation emitted from said optical transmitter and contains an amount of substantially uniformly dispersed second material particles which render said encapsulating mass highly impermeable to optical radiation from outside said coupling device.

2. In an electro-optical device as defined in claim 1 wherein said coupling medium and said encapsulating mass are composed of a synthetic material.

3. In an electro-optical device as defined in claim 1 wherein said coupling medium and said encapsulating mass have a base composed of an identical chemical composition.

4. In an electro-optical device as defined in claim 1 wherein said base is composed of an epoxy resin.

5. In an electro-optical device as defined in claim 1 wherein said first material particles are composed of titanium dioxide.

6. In an electro-optical device as defined in claim 5 wherein the amount of titanium dioxide particles within said encompassing mass ranges from about 10% to 30% by weight, based on the weight of the encapsulating mass.

7. In an electro-optical device as defined in claim 6 wherein the amount of titanium dioxide particles within said enveloping mass is about 30% by weight, based on the weight of the encapsulating mass.

8. In an electro-optical device as defined in claim 1 wherein said second material particles are composed of aluminum bronze.

9. In an electro-optical device as defined in claim 8 wherein the amount of aluminum bronze particles within said encapsulating mass ranges from at least 0.1% to about 0.3% by weight, based on the weight of the encapsulating mass.

10. In an electro-optical device as defined in claim 1 wherein said encapsulating mass has a layer thickness ranging from about 0.5 to 20 mm.

11. In an electro-optical device as defined in claim 10 wherein said encapsulating mass has a layer thickness of 2 mm.

12. In an electro-optical device as defined in claim 1 wherein said encapsulating mass has a reflecting capacity of at least 50% for the radiation emitted from said optical transmitter.

13. In an electro-optical device as defined in claim 1 wherein said encapsulating mass has an absorption capacity of at least 98% for optical radiation entering into said coupling device from the exterior thereof.

14. In an electro-optical device as defined in claim 1 wherein said coupling device has a high voltage strength of at least 4 KV.

15. In an electro-optical device as defined in claim 1 wherein said encapsulating mass includes a substantially uniformly dispersed coloring agent therein.

16. In an electro-optical device as defined in claim 1 wherein said optical transmitter is a diode, such as a luminescent diode and said optical receiver is an element selected from the group consisting of a transistor, a plurality of transistors, a thyristor and a photo-IC element.

* * * * *